United States Patent
Cheng et al.

(10) Patent No.: US 9,374,047 B2
(45) Date of Patent: Jun. 21, 2016

(54) BUFFER CIRCUIT

(71) Applicant: ILI TECHNOLOGY CORP., Hsinchu County (TW)

(72) Inventors: Chih-Kang Cheng, Hsinchu (TW); Tzung-Yun Tsai, Hsinchu (TW)

(73) Assignee: ILI TECHNOLOGY CORP., Hsinchu County (TW)

( * ) Notice: Subject to any disclaimer, the term of this patent is extended or adjusted under 35 U.S.C. 154(b) by 68 days.

(21) Appl. No.: 14/455,991

(22) Filed: Aug. 11, 2014

(65) Prior Publication Data

US 2015/0357974 A1  Dec. 10, 2015

(30) Foreign Application Priority Data

Jun. 9, 2014  (TW) .............................. 103119870 A

(51) Int. Cl.
  *H03F 3/45* (2006.01)
  *H03F 1/02* (2006.01)
  *H03F 3/21* (2006.01)
  *H03F 1/30* (2006.01)
  *H03F 3/30* (2006.01)

(52) U.S. Cl.
  CPC .......... *H03F 3/45179* (2013.01); *H03F 1/0277* (2013.01); *H03F 3/211* (2013.01); *H03F 3/3022* (2013.01); *H03F 3/45475* (2013.01); *H03F 1/307* (2013.01); *H03F 3/30* (2013.01); *H03F 3/45* (2013.01); *H03F 2203/45138* (2013.01)

(58) Field of Classification Search
  CPC ............ H03F 3/45; H03F 2003/45008; H03F 3/45179; H03F 3/68; H03F 1/02

USPC ....................................... 330/124 R, 253, 295
  See application file for complete search history.

(56) References Cited

U.S. PATENT DOCUMENTS

| | | | | |
|---|---|---|---|---|
| 6,310,520 B1 * | 10/2001 | Walden | ................ | H03H 1/0277 330/253 |
| 6,970,152 B1 * | 11/2005 | Bell | ...................... | G09G 3/3688 330/123 |
| 7,907,136 B2 * | 3/2011 | Kobayashi | ............ | H03F 1/0277 345/100 |
| 8,330,501 B1 * | 12/2012 | Santurkar | ............ | G11C 7/1084 330/253 |
| 2009/0231319 A1 * | 9/2009 | Tsuchi | ................. | G09G 3/3688 330/253 |
| 2014/0167847 A1 * | 6/2014 | Cheng | ..................... | H03F 3/602 330/253 |

* cited by examiner

*Primary Examiner* — Khanh V Nguyen
(74) *Attorney, Agent, or Firm* — Li & Cai Intellectual Property (USA) Office

(57) ABSTRACT

The present disclosure provides a buffer circuit comprising a plurality of operational amplifiers and a switch module. Each operational amplifier forms a buffer. The operational amplifier has an output stage. The stage has a first transistor and a second transistor. The first transistor and the second transistor are connected to an output terminal. The first transistor has a first control terminal. The second transistor has a second control terminal. The switch module is connected to the first control terminal of the first transistor and the second control terminal of the second transistor. The switch module connects together at least two of the first terminals of the first transistor according to a control signal. The switch module connects together at least two of the second terminals of the second transistor according to the control signal.

10 Claims, 5 Drawing Sheets

BUFFER CIRCUIT

BACKGROUND OF THE INVENTION

1. Field of the Invention

The instant disclosure relates to an amplifier; in particular, to a buffer circuit having a plurality of amplifiers.

2. Description of Related Art

Please refer to FIG. 1A, FIG. 1B and FIG. 1C respectively showing a schematic diagram of an application for a conventional buffer circuit.

Please refer to FIG. 1A, FIG. 1B and FIG. 1C respectively showing a schematic diagram of an application for a conventional buffer circuit. The buffer circuit can be implemented by one or a plurality of operational amplifiers. As shown in FIG. 1A, the conventional buffer circuit 1 is implemented by an integrated circuit (IC) comprising two operational amplifiers OP1 and OP2. Each operational amplifier has a non-inverting input terminal (+), an inverting input terminal (−) and an output terminal (Vout1 or Vout2). The inverting input terminal (−) of the operational amplifier OP1 is connected with the output terminal Vout1, thus the operational amplifier OP1 forms a buffer. Similarly, the inverting input terminal (−) of the operational amplifier OP2 is connected with the output terminal Vout2, thus the operational amplifier OP2 forms a buffer. The non-inverting input terminal (+) of the operational amplifier OP1 is connected with the input terminal Vin1 (an input pin, for example) of the package 10, and non-inverting input terminal (+) of the operational amplifier OP2 is connected to the input terminal Vin2 of the package 10. As shown in FIG. 1A, the operational amplifiers OP1 and OP2 forming the buffer circuits operate independently. When electricity is not provided to the operational amplifiers OP1 and OP2 for disabling the operational amplifiers OP1 and OP2, the output terminal Vout1 of the operational amplifier OP1 and the output terminal Vout2 of the operational amplifier OP2 can be connected (or biased) to a biasing voltage. As shown in FIG. 1C, the output terminal Vout1 of the operational amplifier OP1 is exemplarily connected to the supply voltage PW, and the output terminal Vout2 of the operational amplifier OP2 is exemplarily connected to the ground GND.

However, in order to make the buffer circuit provide larger drive ability, a plurality of buffer circuits can be connected in parallel. For the application shown in FIG. 1B, the input terminal Vin1 connected with the operational amplifier OP1 and the input terminal Vin2 connected with the operational amplifier OP2 are shorted (or so called "common" to be the input terminal Vin), and the output terminal Vout1 of the operational amplifier OP1 and the output terminal Vout2 of the operational amplifier OP2 are common for being the output terminal Vout. However, the offset voltage of each operational amplifier may be different. As shown in FIG. 2, the operational amplifier OP1 has an offset voltage Vos1, the operational amplifier OP2 has an offset voltage Vos2, such that the voltage level of the output terminal Vout1 of the operational amplifier OP1 may be different from the voltage level of the output terminal Vout2 of the operational amplifier OP2. Therefore, a leakage current $I_L$ may occur between the output terminal Vout1 and the output terminal Vout2, wherein the shown transistor in the operational amplifier is the output stage of the operational amplifier.

SUMMARY OF THE INVENTION

The object of the instant disclosure is to provide a buffer circuit. When at least two operational amplifiers are parallel connected for using, the control terminals of the output stages in the operational amplifiers are connected together for avoiding the occurrence of leakage current.

In order to achieve the aforementioned objects, according to an embodiment of the instant disclosure, a buffer circuit is offered. The buffer circuit comprises a plurality of operational amplifiers and a switch module. Each operational amplifier has a non-inverting input terminal, an inverting input terminal and an output terminal. The inverting input terminal of the operational amplifier is connected with the output terminal, for making the operational amplifier form a buffer. The operational amplifier has an output stage. The output stage has a first transistor and a second transistor. The first transistor and the second transistor are connected with the output terminal. The first transistor has a first control terminal. The second transistor has a second control terminal. The switch module is connected with the first control terminals of the first transistors and the second control terminals of the second transistors of the plurality of operational amplifiers. The switch module connects together at least two of the first control terminals of the first transistors according to a control signal. The switch module connects together at least two of the second control terminals of the second transistors according to the control signal.

In summary, the provided buffer circuit utilizes the switch module to connect the control terminals of the corresponding transistors in the output stages of at least two operational amplifiers (which form the buffers) for avoiding the occurrence of leakage current.

In order to further the understanding regarding the instant disclosure, the following embodiments are provided along with illustrations to facilitate the disclosure of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

[An Embodiment of a Buffer Circuit]

Figure 3:
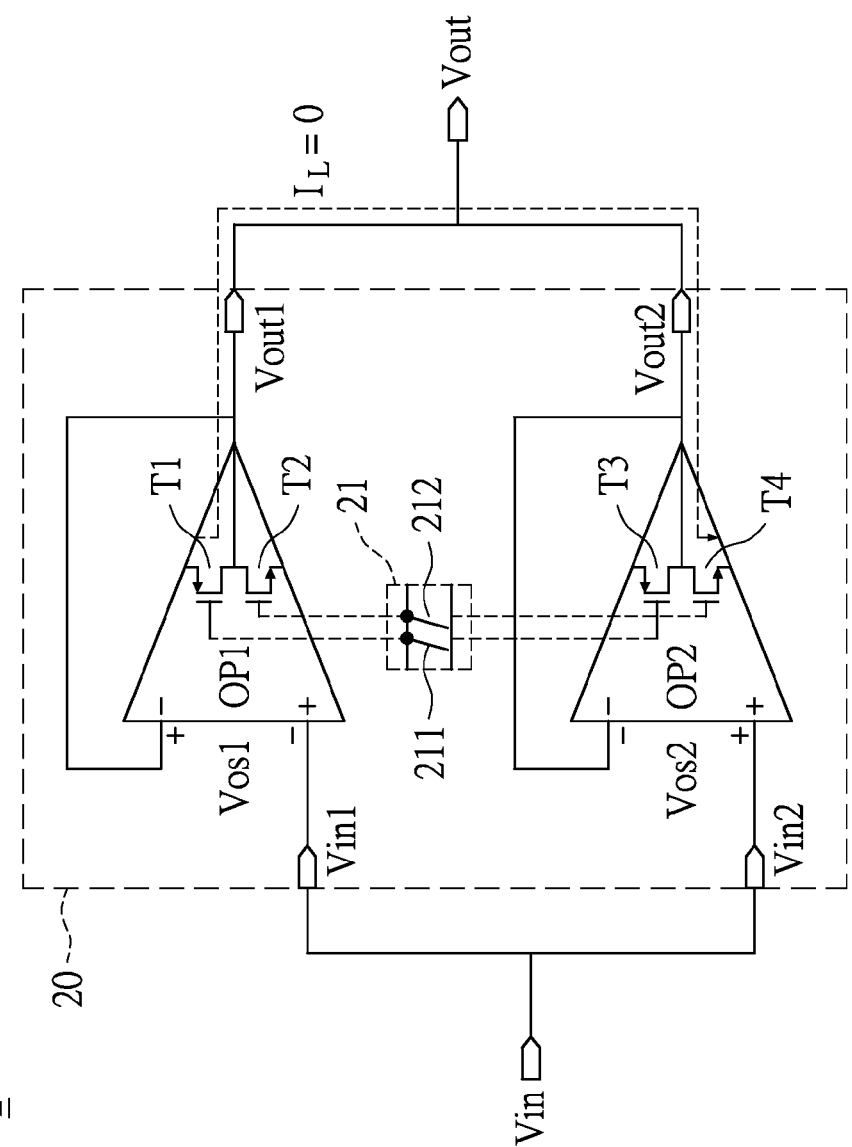
FIG. 3 shows a circuit diagram of a buffer circuit according to an embodiment of the instant disclosure.

Please refer to FIG. 3 showing a circuit diagram of a buffer circuit according to an embodiment of the instant disclosure. The buffer circuit of this embodiment comprises a plurality of operational amplifiers and a switch module. And, the number of the operational amplifiers is not restricted. For example, two operational amplifiers are disclosed for ease of description. As shown in FIG. 3, the buffer circuit 2 comprises an operational amplifier OP1, an operational amplifier OP2, a switch module 21 and a package 20. Each operational amplifier OP1 or OP2 has an offset voltage of itself, in which the offset voltages may be different from each other due to the manufacturing process factors. Additionally, the package 20 is only for describing the requirement for the applied product in order to package and integrate the input terminals and the output terminals of the operational amplifiers, and the package 20 does not affect the operation of the buffer circuit in this embodiment.

The operational amplifier OP1 has a non-inverting input terminal (+), an inverting input terminal (−) and an output terminal Vout1. The inverting input terminal (−) of the operational amplifier OP1 is connected with the output terminal Vout1, for making the operational amplifier OP1 form a buffer. The operational amplifier OP1 has an output stage. The output stage has a first transistor T1 and a second transistor T2. The first transistor T1 and the second transistor T2 are connected with the output terminal Vout1. The first transistor T1 has a first control terminal sp. The second transistor T2 has a second control terminal sn (which is an gate electrode shown in FIG. 3). The operational amplifier OP2 has a non-inverting input terminal (+), an inverting input terminal (−) and an output terminal Vout2. The inverting input terminal (−) of the operational amplifier OP2 is connected with the output terminal Vout2, for making the operational amplifier OP2 form a buffer. The operational amplifier OP2 has an output stage. The output stage has a first transistor T3 and a second transistor T4. The first transistor T3 and the second transistor T4 are connected with the output terminal Vout2. The first transistor T3 has a first control terminal sp. The second transistor T4 has a second control terminal sn. It is worth mentioning that, in this embodiment, the operational amplifier OP1 and the operational amplifier OP2 are operational amplifiers having the same output stages, but the instant disclosure is not so restricted.

Specifically, for the embodiment shown in FIG. 3, regarding to the operational amplifier OP1, the first transistor T1 is the PMOS transistor, the source electrode of the PMOS transistor is connected to a first bias voltage (VDD, for example), the drain electrode of the PMOS transistor is connected to the output terminal Vout1, and the gate electrode of the PMOS transistor is the first control terminal sp. The second transistor T2 is the NMOS transistor, the source electrode of the NMOS transistor is connected to a second bias voltage (grounding or −VDD, for example), the drain electrode of the NMOS transistor is connected to the output terminal Vout1, and the gate electrode of the NMOS transistor is the second control terminal sn. Regarding to the operational amplifier OP2, the first transistor T3 is the PMOS transistor, the source electrode of the PMOS transistor is connected to the first bias voltage (VDD, for example), the drain electrode of the PMOS transistor is connected to the output terminal Vout2, and the gate electrode of the PMOS transistor is the first control terminal sp. The second transistor T4 is the NMOS transistor, the source electrode of the NMOS transistor is connected to the second bias voltage (grounding or −VDD, for example), the drain electrode of the NMOS transistor is connected to the output terminal Vout2, and the gate electrode of the NMOS transistor is the second control terminal sn.

It is worth mentioning that the first transistors T1, T3 and the second transistors T2, T4 may be replaced by other semiconductor devices such as bipolar junction transistors (BJT), Gate Turn-Off Switches (GTO) or insulated-gate bipolar transistors (IGBT) according to the type of the output stage and the circuit design of an artisan of ordinary skill in the art, and the type of the first transistor and the second transistor is not restricted thereto. The output stages constituted by the transistors may be class A, class B or class AB output stages, but the instant disclosure is not so restricted.

The switch module 21 is connected with the first control terminals sp of the first transistors T1, T3 and the second control terminals sn of the second transistors T2, T4 of the operational amplifiers OP1, OP2. The switch module 21 connects together the first control terminals sp of the first transistors T1, T3 according to a control signal (not shown in FIG. 3). The switch module 21 connects together the second control terminals sn of the second transistors T2, T4 according to the control signal. The mentioned control signal is for controlling opening or closing of the first switching element 211 and the second switching element 212. The first switching elements 211 and the second switching element 212 may be semiconductor devices such as bipolar junction transistors (BJT), Semiconductor Field-Effect Transistor (MOSFET), Gate Turn-Off Switches (GTO) or insulated-gate bipolar transistors (IGBT), but the instant disclosure is not so restricted.

Figure 1A:
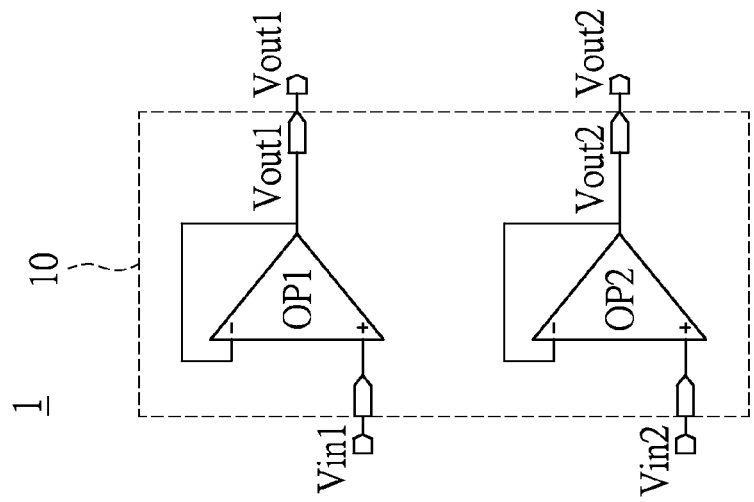
FIG. 1A shows a schematic diagram of an application for a conventional buffer circuit.
Figure 1B:
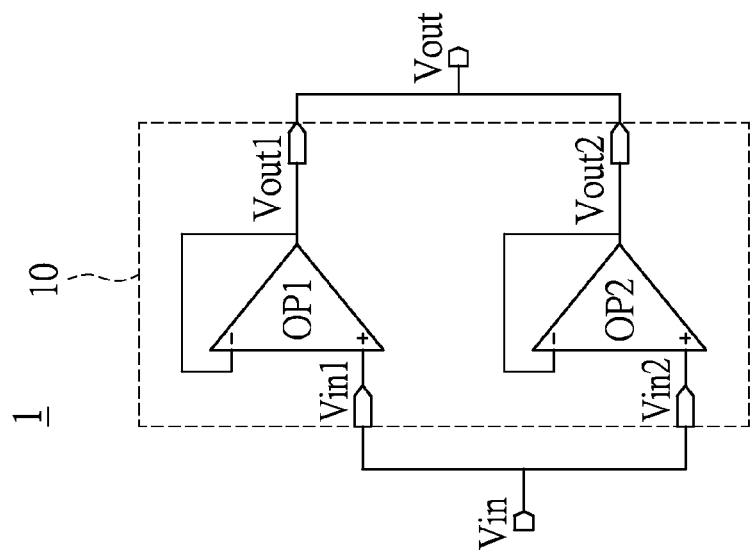
FIG. 1B shows a schematic diagram of an application for a conventional buffer circuit.
Figure 1C:
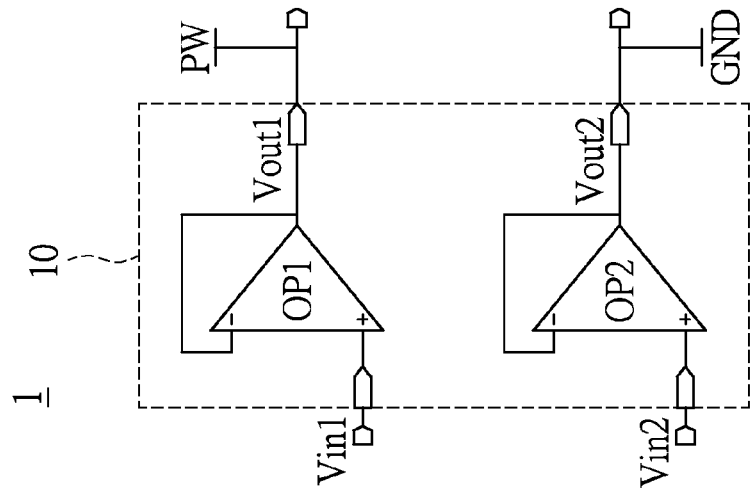
FIG. 1C shows a schematic diagram of an application for a conventional buffer circuit.
Figure 2:
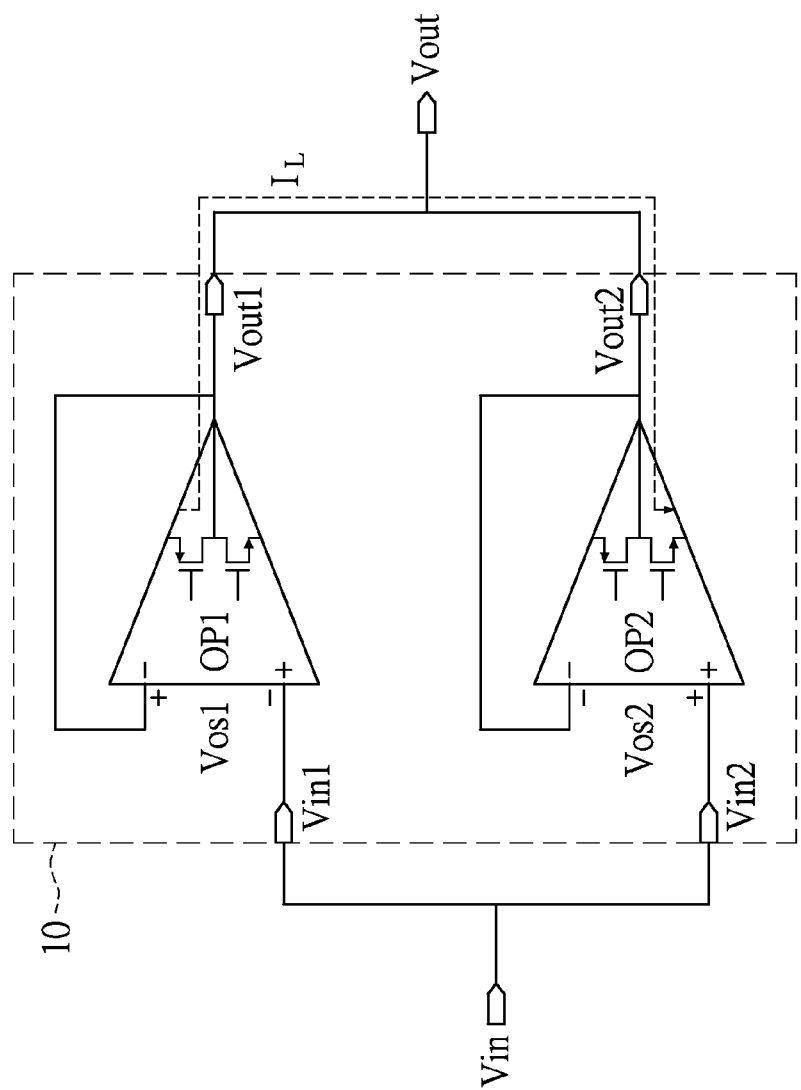
FIG. 2 shows a schematic diagram of the leakage current of a conventional buffer circuit.

Regarding to the application of connecting the buffer in parallel as shown in FIG. 1B, the input terminal Vin1 of the operation amplifier OP1 is connected with the input terminal Vin2 of the operational amplifier OP2, and the output terminal Vout1 of the operational amplifier OP1 is connected with the output terminal Vout2 of the operational amplifier OP2. Meanwhile, because the first control terminal sp of the first transistor T1 and the second control terminal sn of the second transistor T2 of the operational amplifier OP1 are respectively connected with the first control terminal sp of the first transistor T3 and the second control terminal sn of the second transistor T4 of the operational amplifier OP2, the voltage level of the control terminals (which are the first control terminal sp and the second control terminal sn) of the output stages of the operational amplifiers OP1, OP2 are the same, such that the voltage levels of the output terminal Vout1, Vout2 of the operational amplifier OP1, OP2 are the same. Thus, the leakage current $I_L$ between the output terminal Vout1 and the output terminal Vout2 can be eliminated or reduced to zero. Accordingly, the occurrence of leakage current for the conventional buffer circuit can be avoided.

[Another Embodiment of a Buffer Circuit]

Figure 4:
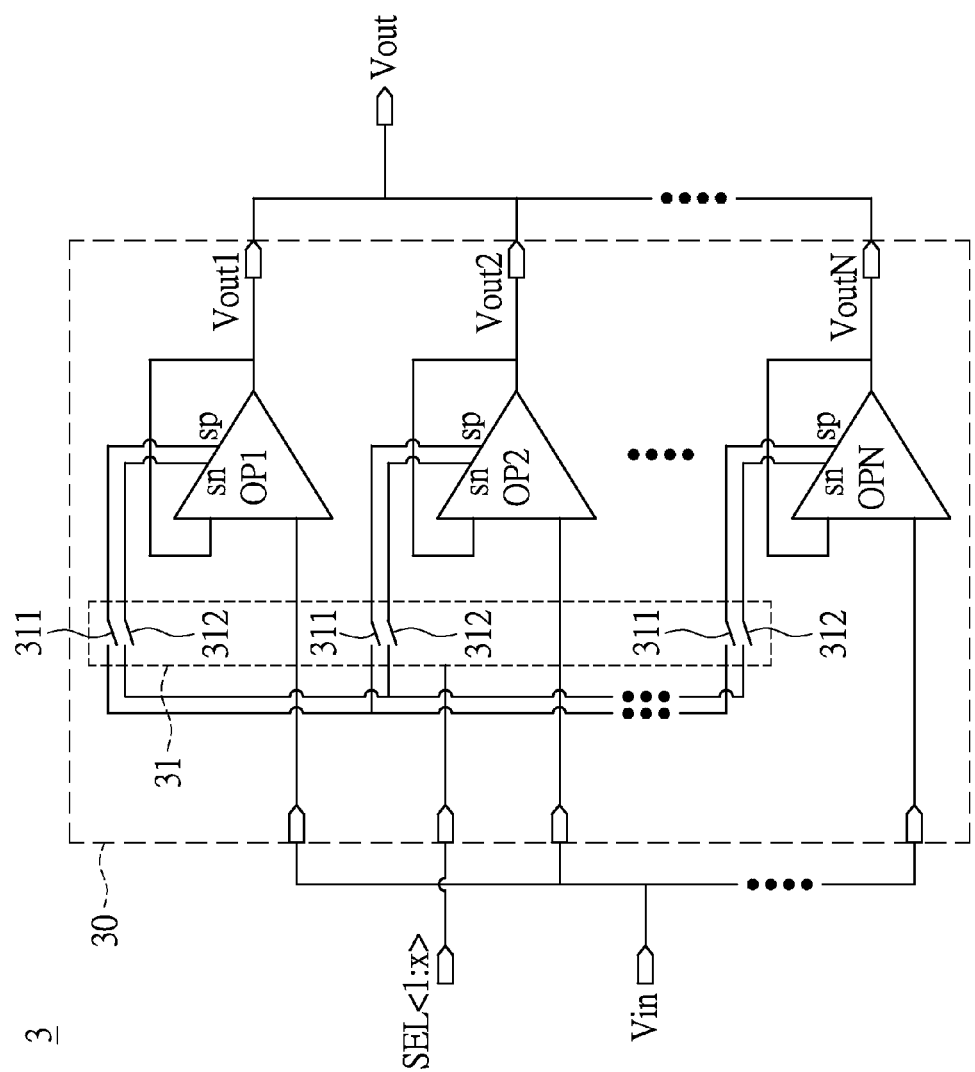
FIG. 4 shows a circuit diagram of a buffer circuit according to another embodiment of the instant disclosure.

The aforementioned embodiment describes the circumstance of the buffer circuit having two operational amplifiers. FIG. 4 further shows another embodiment of the buffer circuit having a plurality of operational amplifiers. Please refer to FIG. 4, the buffer circuit 3 comprises N operational amplifiers OP1, OP2 . . . OPN, a switch module 31 and a package 30, wherein the N is a positive integer.

The operational amplifiers OP1, OP2 . . . OPN have non-inverting input terminals (+), inverting input terminals (−) and output terminals Vout1, Vout2 . . . VoutN. The inverting input terminal (−) of the operational amplifier OP1 is connected with the output terminal Vout1, for making the operational amplifier OP1 form a buffer. The inverting input terminal (−) of the operational amplifier OP2 is connected with the output terminal Vout2, for making the operational amplifier OP2 form a buffer. Similarly, the inverting input terminal (−) of the operational amplifier OPN is connected with the output terminal VoutN, for making the operational amplifier OPN form a buffer. The output stage of each operational amplifier OP1, OP2 . . . or OPN is the same as the output stage mentioned in the previous embodiment. Please refer to FIG. 4 in conjunction with FIG. 3, taking the operational amplifier OP1 as an example, its output stage has the first transistor T1 and the second transistor T2, the first transistor T1 and the second transistor T2 are connected to the output terminal vout1. The first transistor T1 has a first control terminal sp. The second transistor T2 has a second control terminal sn. Similarly, each of the output stages of the operational amplifiers OP2 ... OPN also may have the mentioned first transistor T1 and the second transistor T2.

In the embodiment shown in FIG. 4, the switch module 31 is connected with the first control terminals sp of the first transistors and the second control terminals sn of the second transistors of the operational amplifiers OP1, OP2 ... OPN. The switch module 31 is, for example, a switch array, in which the switch array has N first switching elements 311 and N second switching elements 312, the first switching elements 311 and the second switching elements 312 are controlled by the digitalized control signal SEL<1:x>. According to the conditions of opening or closing the first switching elements and the second switching elements (which indicates the possible cases of opening or closing the switching elements), the number of bits of the digitalized control signal SEL<1:x> can be determined. The first control terminals sp of the first transistors are connected in a one-to-one correspondence to the first switching elements 311, and the second control terminals sn of the second transistors are connected in a one-to-one correspondence to the second switching elements 312

The switch module 31 connects together at least two of the first control terminals sp according to the control signal SEL<1:x>, and the switch module 31 connects together at least two of the second control terminals sn according to the control signal SEL<1:x>. For example, when two operational amplifiers OP1 and OP2 are utilized to be the buffer circuit, the first switching element 311 connecting with the first control terminal sp of the operational amplifier OP1 is closed, and the first switching element 311 connecting with the first control terminal sp of the operational amplifier OP2 is closed, wherein the first switching elements 311 connecting with the first control terminals sp of the other operational amplifiers are opened, thus the first control terminal sp of the operational amplifier OP1 and the first control terminal sp of the operational amplifier OP2 are connected together. Meanwhile, the second switching element 312 connecting with the second control terminal sn of the operational amplifier OP1 is closed, and the second switching element 312 connecting with the second control terminal sn of the operational amplifier OP2 is closed, wherein the second switching elements 312 connecting with the second control terminals sn of the other operational amplifiers are opened, thus the second control terminal sn of the operational amplifier OP1 and the second control terminal sn of the operational amplifier OP2 are connected together.

In other words, according to the used operational amplifiers of the buffer circuit, the corresponding first switching elements 311 and the second switching elements 312 are closed, thus the first control terminal sp of the used operational amplifiers are connected together and the second control terminal sn of the used operational amplifier are connected together. As a result, the leakage current of the output terminal can be eliminated.

For example, when the number of used operational amplifiers is three, there are five application conditions for the buffer circuit. The first condition is that the input terminals of the three operational amplifiers are connected together, and the output terminals are connected together, meanwhile the three corresponding first switching elements 311 are closed and the three corresponding second switching elements 312 are closed. The second condition is that the three operational amplifiers are operating independently, meanwhile the three corresponding first switching elements 311 are opened and the three corresponding second switching elements 312 are opened. The other three conditions are selecting any two operational amplifiers and connecting together two input terminals of the selected two operational amplifiers, and connecting together two output terminals of the corresponding two selected operational amplifiers, meanwhile two corresponding first switching elements 311 are closed and two corresponding second switching elements 312 are closed, in which there are three cases in the selection. Corresponding to the aforementioned five conditions, the digitalized control signal SEL<1:x> may be the digital signal having at least three bits.

[Another Embodiment of the Buffer Circuit]

Figure 5:
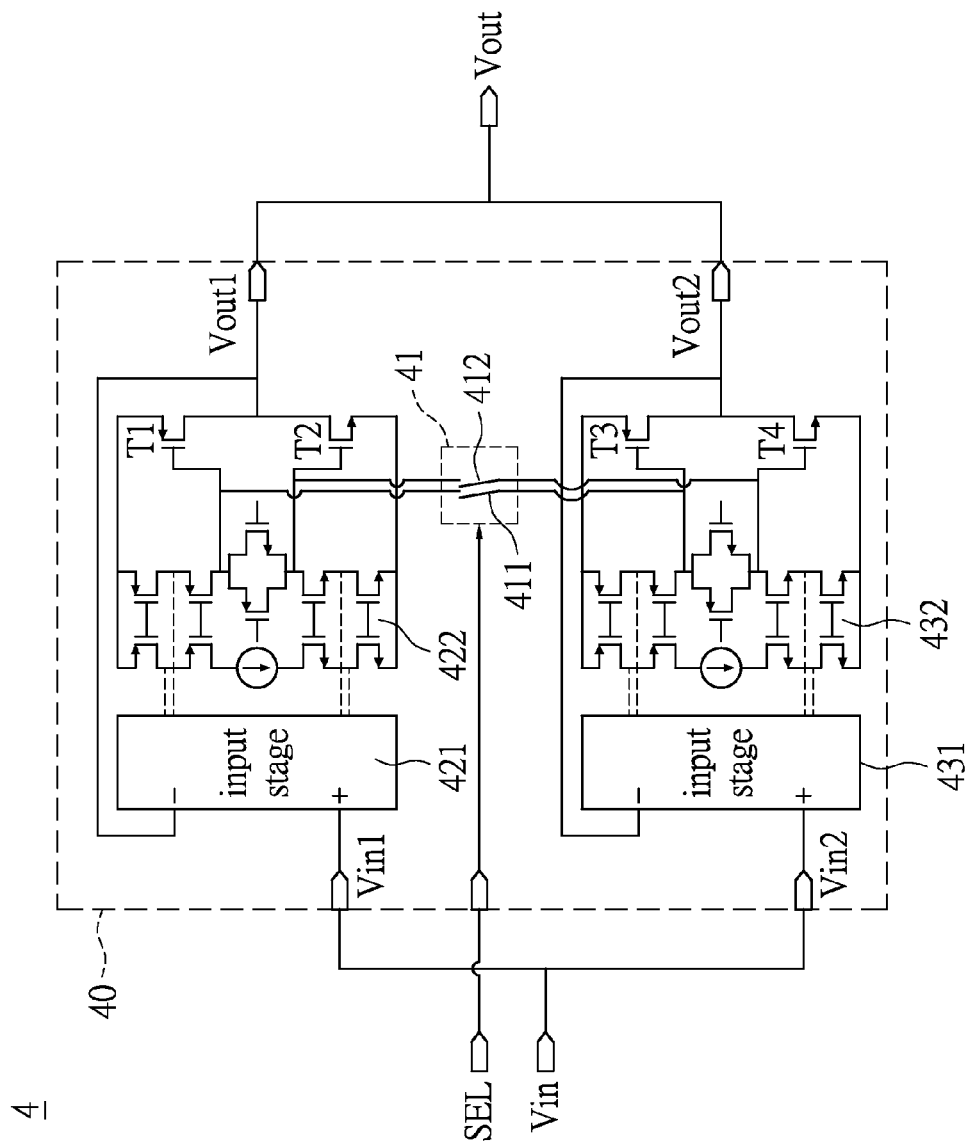
FIG. 5 shows a detailed circuit diagram of a buffer circuit according to another embodiment of the instant disclosure.

Please refer to FIG. 3 in conjunction with FIG. 5, FIG. 5 shows a detailed circuit diagram of a buffer circuit according to another embodiment of the instant disclosure. The buffer circuit 4 is a detailed circuit of the buffer circuit 2 of FIG. 3. The buffer circuit comprises an operational amplifier constituted by an input stage 421, a second stage circuit 422 and an output stage (T1 and T2), an operational amplifier constituted by an input stage 431, a second stage circuit 432 and an output stage (T3 and T4), a switch module 41 and a package 40. The switch module 41 comprises a first switching element 411 and a second switching element 412. The switch module 41 receives the control signal SEL to open or close the first switching element 411 and the second switching element 412.

The input stage 421 has a non-inverting input terminal (+), an inverting input terminal (−), in which the non-inverting input terminal (+) is connected with the input terminal Vin1, and the inverting input terminal (−) of the input stage 421 is connected with the output terminal Vout1 of output stage. The input stage 431 has a non-inverting input terminal (+), an inverting input terminal (−), in which the non-inverting input terminal (+) is connected with the input terminal Vin2, and the inverting input terminal (−) of the input stage 431 is connected with the output terminal Vout2 of output stage. That is, the input stage 421 (or 431) is connected with the non-inverting input terminal (+) and the inverting input terminal (−) of the operational amplifier OP1 (or OP2). The second circuit 422 is connected with the input stage 421 and the first transistor T1 and the second transistor T2 of the output stage. The second circuit 432 is connected with the input stage 431 and the first transistor T3 and the second transistor T4 of the output stage.

The first switching element 411 is closed for connecting together the control terminal of the first transistor T1 and the control terminal of the first transistor T3. The second switching element 412 is closed for connecting together the control terminal of the second transistor T2 and the control terminal of the second transistor T4. In this embodiment, the first transistors T1, T3 are PMOS transistors, the source electrodes of the first transistors T1, T3 are connected with the first bias voltage (VDD, for example), the drain electrodes of the first transistors T1, T3 are commonly connected with the output terminal Vout (the output terminal Vout1 and the output terminal Vout2 are connected together). The source electrodes of the second transistor T2, T4 are connected with the second bias voltage (−VDD, for example), the drain electrodes of the second transistors T2, T4 are commonly connected with the output terminal Vout. The circuit constituted by the first transistor T1 and the second transistor T2 representing the output stage may be replaced by other types of output stages, such as the class A, class B or class AB output stages, but the instant disclosure is not so restricted. Additionally, the second stage circuits 422, 432 shown in FIG. 5 are also described for an example, an artisan of ordinary skill in the art will appreciate the implementation manner of the input stage, the second stage and the output stage, thus there is no need to go into details. Further, this instant disclosure does not limit the architecture of the circuit (which may comprises a third stage circuit, a fourth stage circuit . . . and so on, for example) between the input stage and the output stage.

Additionally, in another embodiment, at least one input stage circuit 421 or 431 of the operational amplifiers may be disabled. Or, at least one second stage circuit 422 or 432 of the operational amplifiers may be disabled. According to above, in practical applications, when only one operational amplifier is needed to be used and larger drive ability for the rear stage is needed, the output stages of other not used operational amplifiers can be utilized, and other parts of the circuits of the not used operational amplifiers are disabled for reducing the power consumption. For example, at least one of the input stage 421 and the second stage 422 is disabled, then the first transistor T1 and the second transistor T2 are not controlled by the second stage circuit 422. Meanwhile, the input stage 431 receives the input signals, and the second stage circuit 432 generates two gate control signals to respectively control the first transistor T3 and the second transistor T4. At the meantime, the switch module 41 is utilized to connect together the gate electrode of the first transistor T1 and the gate electrode of the first transistor T3, and connect together the gate electrode of the second transistor T2 and the gate electrode of the second transistor T4. Therefore, only one operational amplifier is operating theoretically, however double of drive ability can be provided.

According to above descriptions, the provided buffer circuit utilizes the switch module to connect the control terminals of the corresponding transistors in the output stages of at least two operational amplifiers (which form the buffers) for avoiding the occurrence of leakage current. Additionally, the output stages of not used operational amplifiers can be utilized to improve the drive ability of the output stage.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A buffer circuit, comprising:
   a plurality of operational amplifiers, each operational amplifier having a non-inverting input terminal, an inverting input terminal and an output terminal, wherein the inverting input terminal of the operational amplifier are connected with the output terminal, for making the operational amplifier form a buffer, wherein the operational amplifier has an output stage, the output stage has a first transistor and a second transistor, the first transistor and the second transistor are connected with the output terminal, the first transistor has a first control terminal, the second transistor has a second control terminal; and
   a switch module, connected with the first control terminals of the first transistors and the second control terminals of the second transistors of the plurality of operational amplifiers, and the switch module connecting together at least two of the first control terminals of the first transistors according to a control signal, the switch module connecting together at least two of the second control terminals of the second transistors according to the control signal.

2. The buffer circuit according to claim 1, wherein at least two of the non-inverting input terminals of the operational amplifiers are connected together, and at least two of the output terminals of the operational amplifiers are connected together.

3. The buffer circuit according to claim 1, wherein each of the operational amplifiers has an offset voltage.

4. The buffer circuit according to claim 1, wherein the first transistor is the PMOS transistor, the source electrode of the PMOS transistor is connected to a first bias voltage, the drain electrode of the PMOS transistor is connected to the output terminal, and the gate electrode of the PMOS transistor is the first control terminal.

5. The buffer circuit according to claim 4, wherein the second transistor is the NMOS transistor, the source electrode of the NMOS transistor is connected to a second bias voltage, the drain electrode of the NMOS transistor is connected to the output terminal, and the gate electrode of the NMOS transistor is the second control terminal.

6. The buffer circuit according to claim 1, wherein each of the operational amplifiers has an input stage, the input stage is connected to the non-inverting input terminal and the inverting input terminal, wherein at least one of the input stage of the operational amplifiers is disabled.

7. The buffer circuit according to claim 6, wherein each of the operational amplifiers has a second stage circuit, the second stage circuit is connected to the input stage, wherein at least one second stage circuit of the operational amplifiers is disabled.

8. The buffer circuit according to claim 1, wherein the switch module is a switch array, the switch array receives the control signal.

9. The buffer circuit according to claim 8, wherein the number of the operational amplifiers is N, the N is an integer ≥two, the switch array has N first switching elements and N second switching elements, the first switching elements and the second switching elements are controlled by the control signal, wherein the first control terminals of the first transistors are connected in a one-to-one correspondence to the first switching elements, the second control terminals of the second transistors are connected in a one-to-one correspondence to the second switching elements.

10. The buffer circuit according to claim 1, wherein the output stages of the operational amplifiers are class A, class B or class AB output stages.

* * * * *